(12) United States Patent
Hwang et al.

(10) Patent No.: US 8,143,950 B2
(45) Date of Patent: Mar. 27, 2012

(54) POWER AMPLIFIER BREAK DOWN CHARACTERISTIC

(75) Inventors: Hyeon Seok Hwang, Seoul (KR); Yoo Sam Na, Seoul (KR); Moon Suk Jeong, Gyunggi-do (KR); Gyu Suck Kim, Seoul (KR); Byeong Hak Jo, Gyunggi-do (KR)

(73) Assignee: Samsung Electro-Mechanics Co., Ltd, Suwon, Gyunggi-Do (KR)

( * ) Notice: Subject to any disclaimer, the term of this patent is extended or adjusted under 35 U.S.C. 154(b) by 102 days.

(21) Appl. No.: 12/712,071

(22) Filed: Feb. 24, 2010

(65) Prior Publication Data

US 2011/0156817 A1 Jun. 30, 2011

(30) Foreign Application Priority Data

Dec. 29, 2009 (KR) ........................ 10-2009-0133017

(51) Int. Cl.
*H03F 1/52* (2006.01)
*H03F 1/22* (2006.01)
(52) U.S. Cl. ........................ 330/298; 330/311
(58) Field of Classification Search .................... 330/98, 330/99, 100, 292, 295, 298, 311
See application file for complete search history.

(56) References Cited

U.S. PATENT DOCUMENTS

| | | | | |
|---|---|---|---|---|
| 6,473,595 B1* | 10/2002 | Kim et al. | ..................... | 455/63.1 |
| 7,205,846 B1* | 4/2007 | Ding et al. | ..................... | 330/311 |
| 7,362,183 B2* | 4/2008 | Kim et al. | ..................... | 330/311 |
| 2009/0212870 A1* | 8/2009 | Chen et al. | ..................... | 330/295 |

FOREIGN PATENT DOCUMENTS

JP 2006-186159 A 7/2006

OTHER PUBLICATIONS

Office Action from counterpart Korean Patent Application No. 10-2009-0133017, Mar. 11, 2011, 3 pages.

* cited by examiner

*Primary Examiner* — Steven J Mottola
(74) *Attorney, Agent, or Firm* — Blakely Sokoloff Taylor & Zafman LLP (57) ABSTRACT

Disclosed herein is a power amplifier. The power amplifier includes a first common source transistor for amplifying an input signal into a predetermined level, a second common source transistor for compensating for input capacitance and performing auxiliary amplification for the first common source transistor, and a common gate transistor connected to the first common source transistor in a cascode structure, configured to be connected in parallel to the second common source transistor and prevent the first common source transistor from breaking down, and configured to output a signal amplified by a value obtained by adding the gain of the first common source transistor and the gain of the second common source transistor to each other.

6 Claims, 6 Drawing Sheets

FIG.1

Prior art

FIG.2

Prior art

FIG.3

Prior art

FIG.6

POWER AMPLIFIER BREAK DOWN CHARACTERISTIC

CROSS REFERENCE TO RELATED APPLICATION

This application claims the benefit of Korean Patent Application No. 10-2009-0133017, filed on Dec. 29, 2009, entitled "Power Amplifier," which is hereby incorporated by reference in its entirety into this application.

BACKGROUND OF THE INVENTION

1. Technical Field

The present invention relates to a power amplifier.

2. Description of the Related Art

A Wideband Code Division Multiple Access (WCDMA) power amplifier requires a linear power of 28.5 dBm and an output of a maximum of 32 dBm.

Furthermore, the IMD3 linear characteristic must be equal to or higher than 25 dBc.

However, when a WCDMA power amplifier is implemented using a CMOS, a gate oxide film breaks down due to load mismatch, or a punch through between a drain and a source occurs, thereby breaking down a circuit.

Therefore, it is required to design a power amplifier considering the margin adjustable by a CMOS device as well as the maximum output power.

Figure 1:
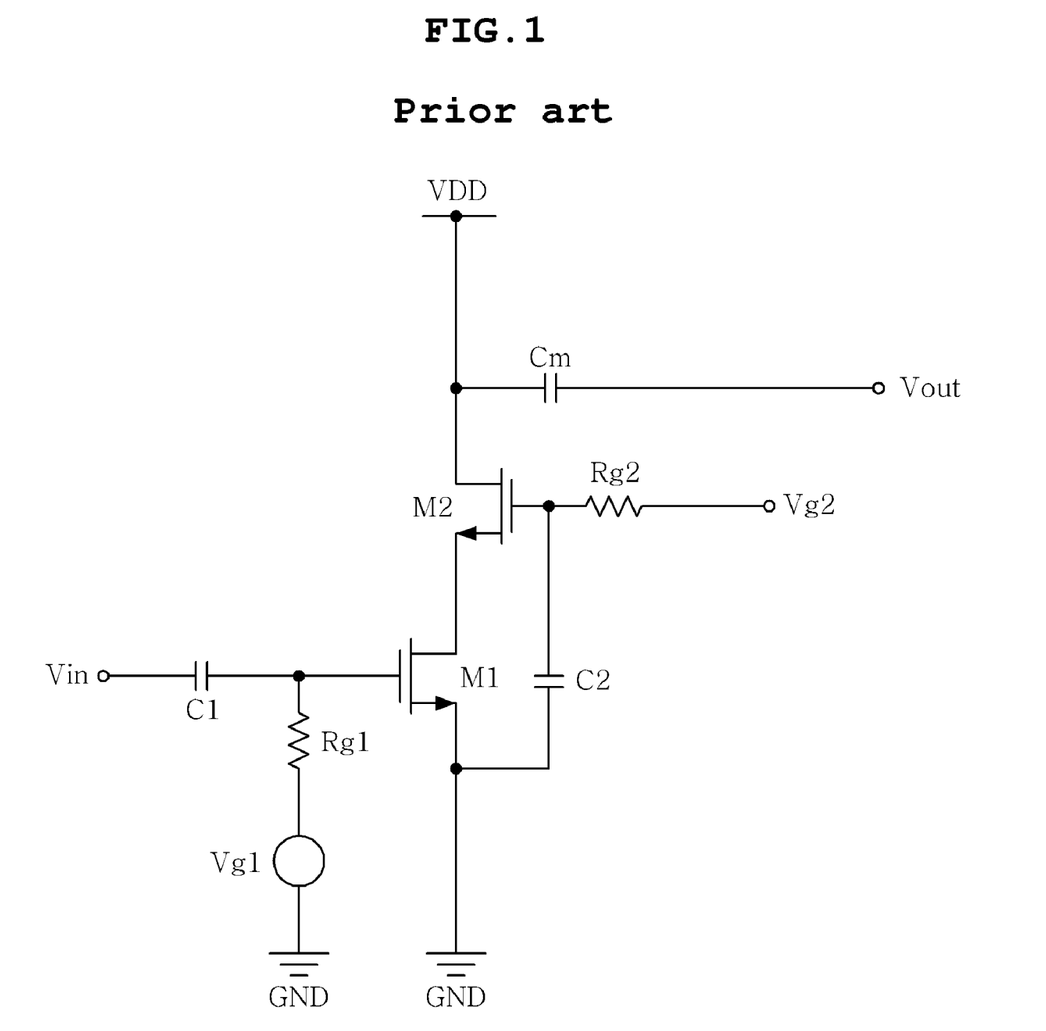
FIG. 1 is a diagram showing a conventional cascode power amplifier.

Up to the present, the breakdown of the circuit has been avoided by using a cascode power amplifier which uses a transistor having a short gate length (a thin oxide) as a common source and uses a transistor having a long gate length (a thick oxide) as a common gate, as shown in FIG. 1.

FIG. 1 is a diagram showing a conventional cascode power amplifier.

The conventional power amplifier includes a common source transistor M1 and a common gate transistor M2, as shown in FIG. 1, and is configured in a cascode structure in which the drain terminal of the common source transistor M1 and the source terminal of the common gate transistor M2 are connected to each other.

In the power amplifier having a cascode structure, the common gate transistor M2 prevents the common source transistor M1 from being degraded through breakdown by voltage applied to a drain terminal, which is an output terminal Vout, thereby enabling stable amplification.

For this purpose, the conventional power amplifier is configured such that the drain terminal of the common source transistor M1 is connected to the source terminal of the common gate transistor M2, the source terminal of the common source transistor M1 is connected to a ground GND, and the gate terminal of the common source transistor M1 is connected to an input terminal Vin.

Meanwhile, a first capacitor C1 is disposed between the gate terminal of the common source transistor M1 and the input terminal Vin, and removes noise from an input signal sent from the input terminal Vin.

Furthermore, a first bias power source Vg1 for driving the common source transistor M1 and a first resistor Rg1 are connected between the gate terminal of the common source transistor M1 and the ground GND.

The drain terminal of the common gate transistor M2 is connected to a driving voltage VDD, the source terminal of the common gate transistor M2 is connected to the drain terminal of the common source transistor M1, and the gate terminal of the common gate transistor M2 is connected to a second bias power source Vg2 via a second resistor Rg2.

Meanwhile, the drain terminal of the common gate transistor M2 is connected to the output terminal Vout of the power amplifier, a third capacitor Cm for removing noise from an output amplified signal is disposed between the drain terminal of the common gate transistor M2 and the output terminal Vout, and a matching circuit or a power connection terminal is connected to the output terminal Vout.

Furthermore, a second capacitor C2 for removing noise from a signal is connected between the gate terminal of the common gate transistor M2 and the source terminal of the common source transistor M1.

In the conventional cascode power amplifier, the common gate transistor M2 is generally formed of an NMOSFET having a long gate length, that is, a thick oxide film, so as to improve the breakdown characteristic of the common source transistor M1, and the common source transistor M1 is formed of an NMOSFET having a short gate length, that is, a thin oxide film, so as to increase an amplification factor for an input signal.

Figure 2:
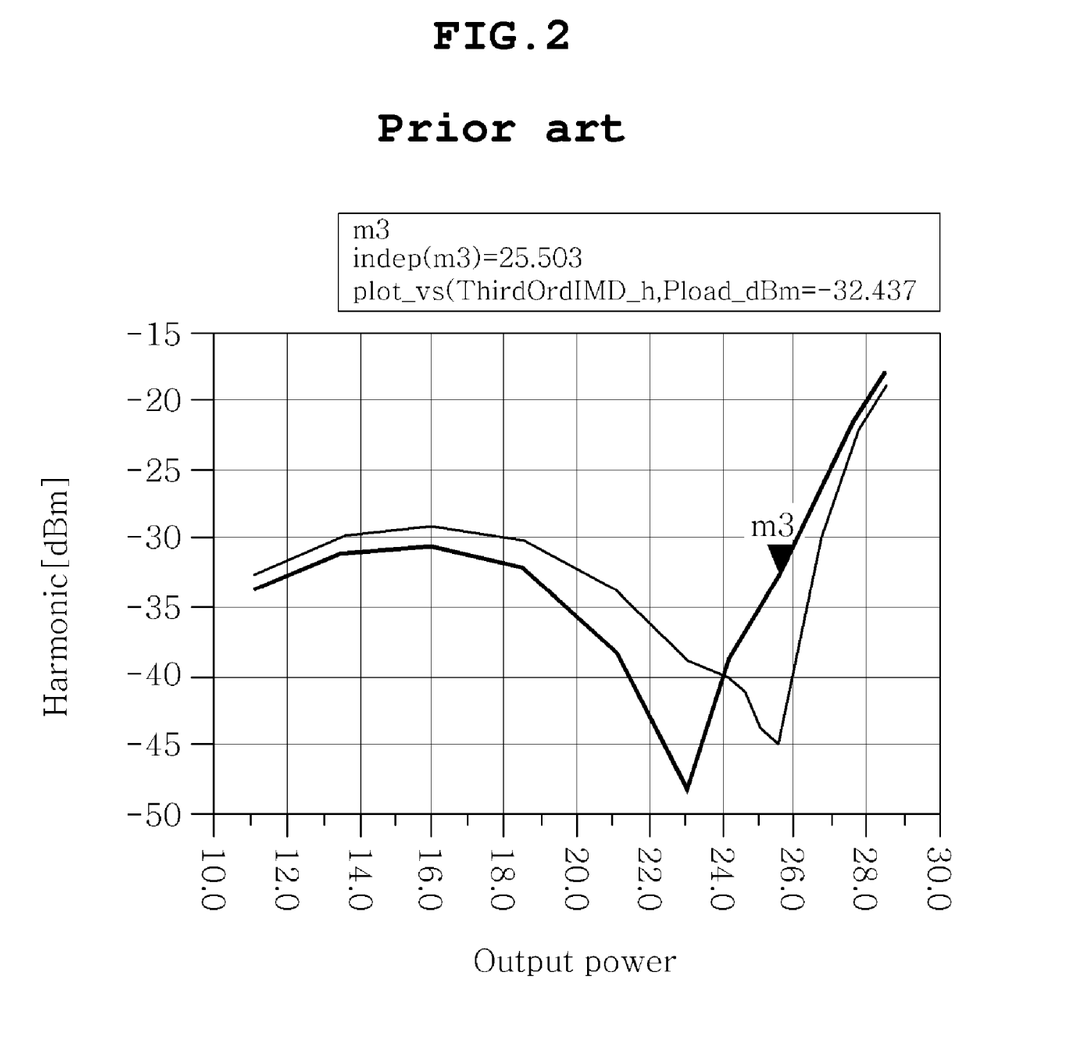
FIG. 2 is a graph illustrating the amplification gain of the conventional cascode power amplifier.
Figure 3:
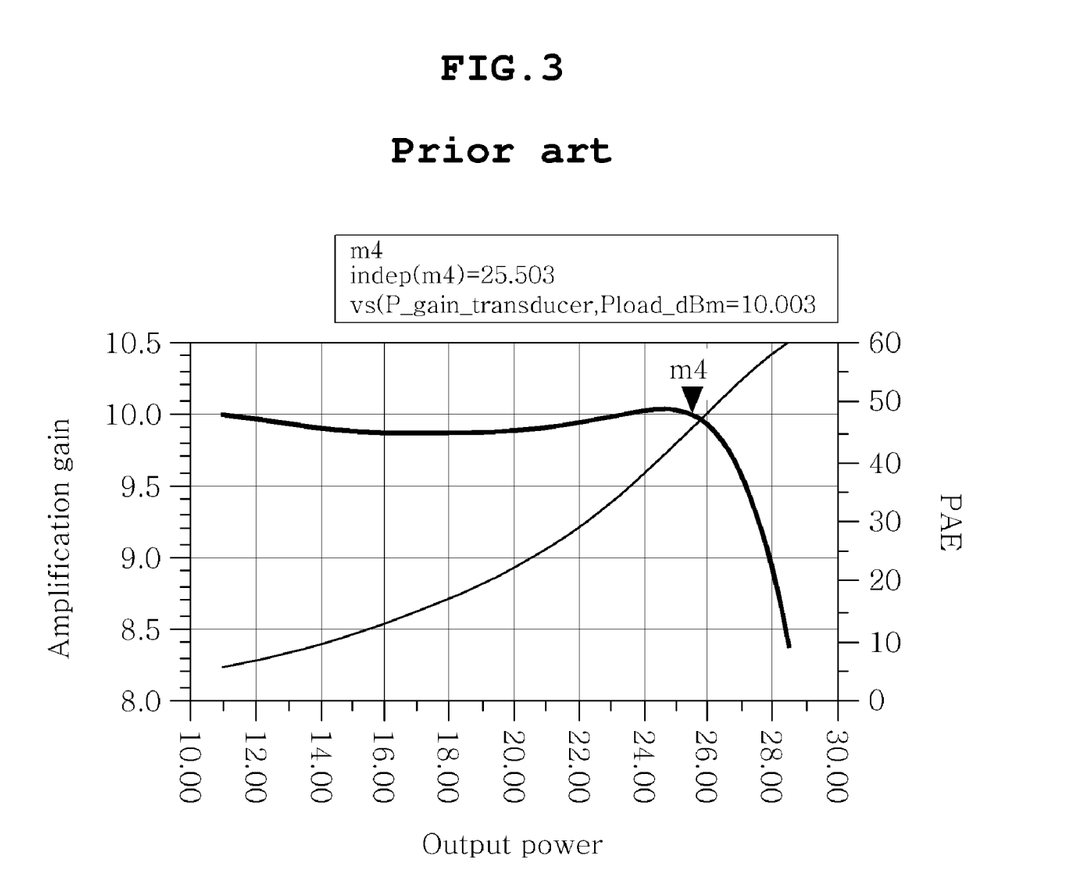
FIG. 3 is a graph illustrating the harmonic characteristic of the conventional cascode power amplifier.

Accordingly, the conventional cascode power amplifier has the amplification gain and harmonic characteristic shown in FIGS. 2 and 3.

Referring to FIGS. 2 and 3, the conventional cascode power amplifier has an amplification gain of 10.003 dBm, a power efficiency of 45.739%, and a harmonic characteristic of −32.437 dBm at an output power of 25.503 dBm.

The conventional cascode power amplifier is configured such that the voltage difference between the gate and drain of the common source transistor M1 is greater than the voltage difference between the gate and drain of the common gate transistor M2. This difference increases in proportion to output power, and must be maintained at a specific voltage so as to prevent the circuit from breaking down.

Accordingly, in order to improve a breakdown characteristic, a common source transistor M1 having a thick oxide film must be used. However, when the common source transistor M1 having a thick oxide film is used, the breakdown characteristic can be improved, but the gain characteristic is insufficient, so that desired output power cannot be achieved.

SUMMARY OF THE INVENTION

Accordingly, the present invention has been made keeping in mind the above problems occurring in the prior art, and the present invention is intended to provide a power amplifier which is capable of improving a breakdown characteristic and output gain.

According to the present invention, there is provided a power amplifier, including a first common source transistor for amplifying an input signal into a predetermined level; a second common source transistor for compensating for input capacitance and performing auxiliary amplification for the first common source transistor; and a common gate transistor connected to the first common source transistor in a cascode structure, configured to be connected in parallel to the second common source transistor and prevent the first common source transistor from breaking down, and configured to output a signal amplified by a value obtained by adding the gain of the first common source transistor and the gain of the second common source transistor to each other.

The first common source transistor, the second common source transistor and the common gate transistor may have thick oxide films.

The first common source transistor and the common gate transistor may be formed of NMOSFETs, and the second common source transistor may be formed of a PMOSFET.

The first common source transistor may operate at class AB, and the second common source transistor may operate at class A.

The second common source transistor may be formed to have a size smaller than those of the first common source transistor and the common gate transistor.

The power amplifier may further include a capacitor connected between a gate terminal of the first common source transistor and a gate terminal of the second common source transistor so as to achieve decoupling between the first common source transistor and the second common source transistor.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Reference now should be made to the drawings, in which the same reference numerals are used throughout the different drawings to designate the same or similar components.

Preferred embodiments of the present invention will be described in detail below with reference to the accompanying drawings.

Figure 4:
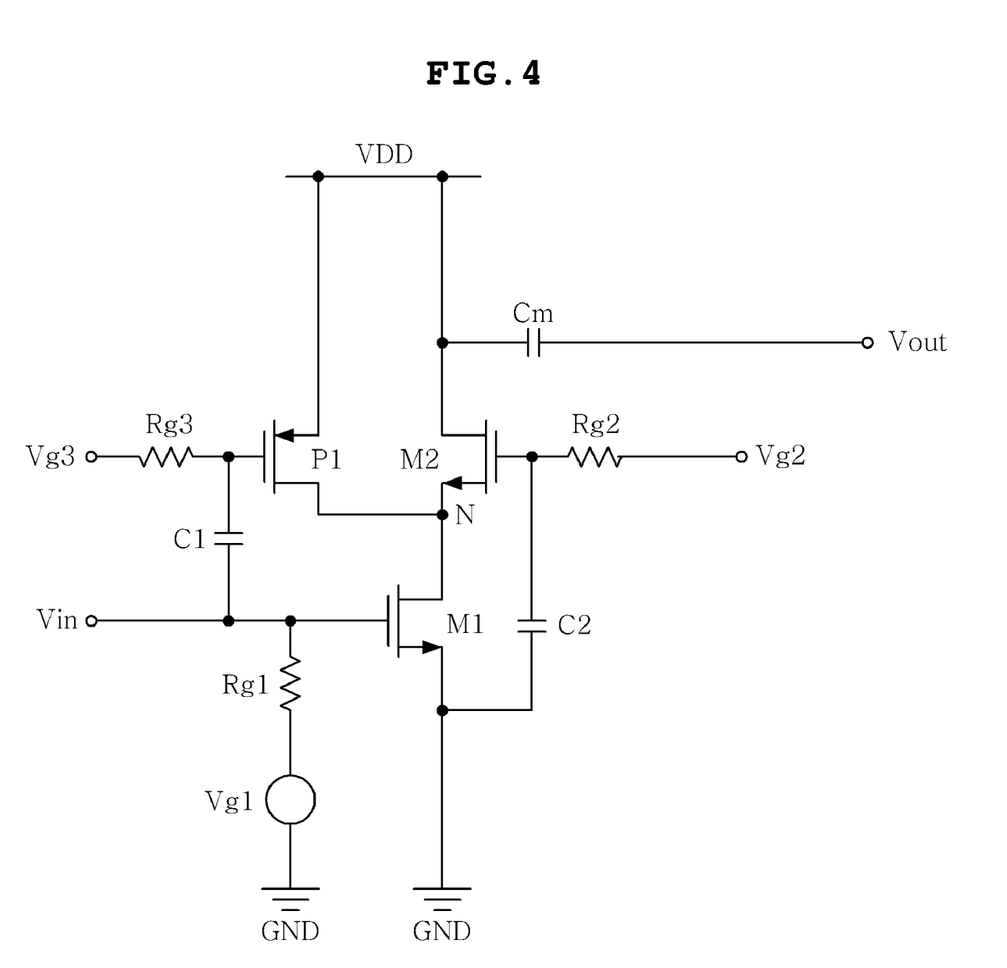
FIG. 4 is a drawing showing a power amplifier according to an embodiment of the present invention.

FIG. 4 is a diagram showing a power amplifier according to an embodiment of the present invention.

As shown in FIG. 4, the power amplifier according to the embodiment of the present invention includes a first common source transistor M1, and a second common source transistor P1 and a common gate transistor M2 which are connected in parallel to the drain terminal of the first common source transistor M1.

Here, the first common source transistor M1 and the second common source transistor P1 are connected to form an inverter structure.

The first common source transistor M1 is formed of an NMOSFET having a thick oxide film, that is, a long gate length, so as to guarantee a high gate oxide film breakdown voltage, and amplifies an input signal, applied to the gate terminal via the input terminal Vin, to a predetermined level.

The drain terminal of the first common source transistor M1 is connected to a common terminal N between the drain terminal of the second common source transistor P1 and the source terminal of the common gate transistor M2, the source terminal of the first common source transistor M1 is connected to a ground GND, and the gate terminal of the first common source transistor M1 is connected to the input terminal Vin.

Furthermore, a first resistor Rg1 and a first bias power source Vg1 are connected in series between the gate terminal of the first common source transistor M1 and the ground GND.

In this case, when the voltage of the first bias power source Vg1 is applied to the gate terminal of the first common source transistor M1, the first resistor Rg1 prevents excessive current from flowing into the gate terminal of the first common source transistor M1.

The first common source transistor M1 is turned on when a first bias is supplied from the first bias power source Vg1, and is turned off when the first bias is not supplied.

The first common source transistor M1 is turned on when the first bias is supplied, and amplifies an input signal, supplied from the input terminal Vin to the gate terminal, to a predetermined level.

The first common source transistor M1 operates at a class AB bias point so as to support the efficiency and linear characteristic of the power amplifier.

The second common source transistor P1 is formed of a PMOSFET having a thick oxide film, that is, a long gate length, is connected between the driving voltage VDD and the first common source transistor M1 to form an inverter structure along with the first common source transistor M1, and performs auxiliary amplification for the first common source transistor M1 and compensates for input capacitance.

The source terminal of the second common source transistor P1 is connected to the driving voltage VDD, the drain terminal of the second common source transistor P1 is connected to a common terminal N between the drain terminal of the first common source transistor M1 and the source terminal of the common gate transistor M2, and the gate terminal of the second common source transistor P1 is connected to a third bias power source Vg3 via a third resistor Rg3.

A first capacitor C1 is disposed between the gate terminal of the second common source transistor P1 and the gate terminal of the first common source transistor M1 to realize decoupling. Due to the presence of the first capacitor C1, a first bias and a third bias may be applied to the gate terminals of the second common source transistor P1 and the first common source transistor M1, respectively.

Furthermore, the first capacitor C1 transmits input signals, transmitted via an input terminal Vin, to the gate terminals of the first common source transistor M1 and the second common source transistor P1.

Here, the input signals transmitted to the gate terminals of the first common source transistor M1 and the second common source transistor P1 have the same magnitude but different phase values.

In other words, when (+) input signal is transmitted to the gate terminal of the first common source transistor M1, (−) input signal is transmitted to the gate terminal of the second common source transistor P1.

The second common source transistor P1 operates at a class A bias point.

Here, the second common source transistor P1 is formed to have a size smaller than those of the first common source transistor M1 and the common gate transistor M2.

Meanwhile, the second common source transistor P1 is turned on when a third bias is supplied from the third bias power source Vg3 to the gate terminal, and is turned off when a third bias is not supplied to the gate terminal.

The second common source transistor P1 is turned on when the third bias is supplied to the gate terminal, amplifies the input signal supplied to the gate terminal, and supplies the amplified signal to the common terminal N between the drain terminal of the first common source transistor M1 and the source terminal of the common gate transistor M2.

Therefore, a signal amplified by the first common source transistor M1 and a signal amplified by the second common source transistor P1 are added together at the common terminal N between the drain terminal of the first common source transistor M1 and the source terminal of the common gate transistor M2, and the common gate transistor M2 outputs an amplified signal obtained by the addition at the common terminal N.

The common gate transistor M2 is formed of an NMOSFET having a thick oxide film, that is, a long gate length, forms a cascode structure along with the first common source transistor M1, is connected between the driving voltage VDD and the first common source transistor M1 to be connected in parallel with the second common source transistor P1, and prevents the first common source transistor M1 from breaking down.

The drain terminal of the common gate transistor M2 is connected to the driving voltage VDD, the source terminal of the common gate transistor M2 is connected to the common terminal N between the drain terminals of the first common source transistor M1 and the second common source transistor P1, and the gate terminal of the common gate transistor M2 is connected to the second bias power source Vg2 via the second resistor Rg2.

A second capacitor C2 is disposed between the gate terminal of the common gate transistor M2 and the source terminal of the first common source transistor M1 (that is, a ground GND), and removes DC components between the gate terminal of the common gate transistor M2 and the source terminal of the first common source transistor M1.

Furthermore, the drain terminal of the common gate transistor M2 is connected to the output terminal Vout of the power amplifier, the output terminal Vout is connected to a matching circuit or a power connection terminal, and a third capacitor Cm is disposed between the output terminal Vout and the drain terminal of the common gate transistor M2.

Here, the third capacitor Cm not only removes noise from an output signal, but also prevents noise from being transmitted from the output terminal Vout to the drain terminal of the common gate transistor M2.

The common gate transistor M2 outputs the input signal, amplified by the gain of the first common source transistor M1 and the gain of the second common source transistor P1, to the output terminal Vout.

In detail, when the first common source transistor M1 and the second common source transistor P1 are operated by the first bias and the third bias, the input signal is amplified by a value obtained by adding the gain of the first common source transistor M1 and the gain of the second common source transistor P1 and is transmitted to the source terminal N of the common gate transistor M2, and the amplified signal transmitted to the source terminal N of the common gate transistor M2 is output to the output terminal Vout through the drain terminal of the common gate transistor M2.

Although a single common gate transistor M2 is illustrated in FIG. 4, two or more common gate transistors M2 connected in a stack structure between the driving voltage VDD and the first common source transistor M1 may be used such that the first common source transistor M1 can tolerate the peak voltage of the amplified signal.

Figure 5:
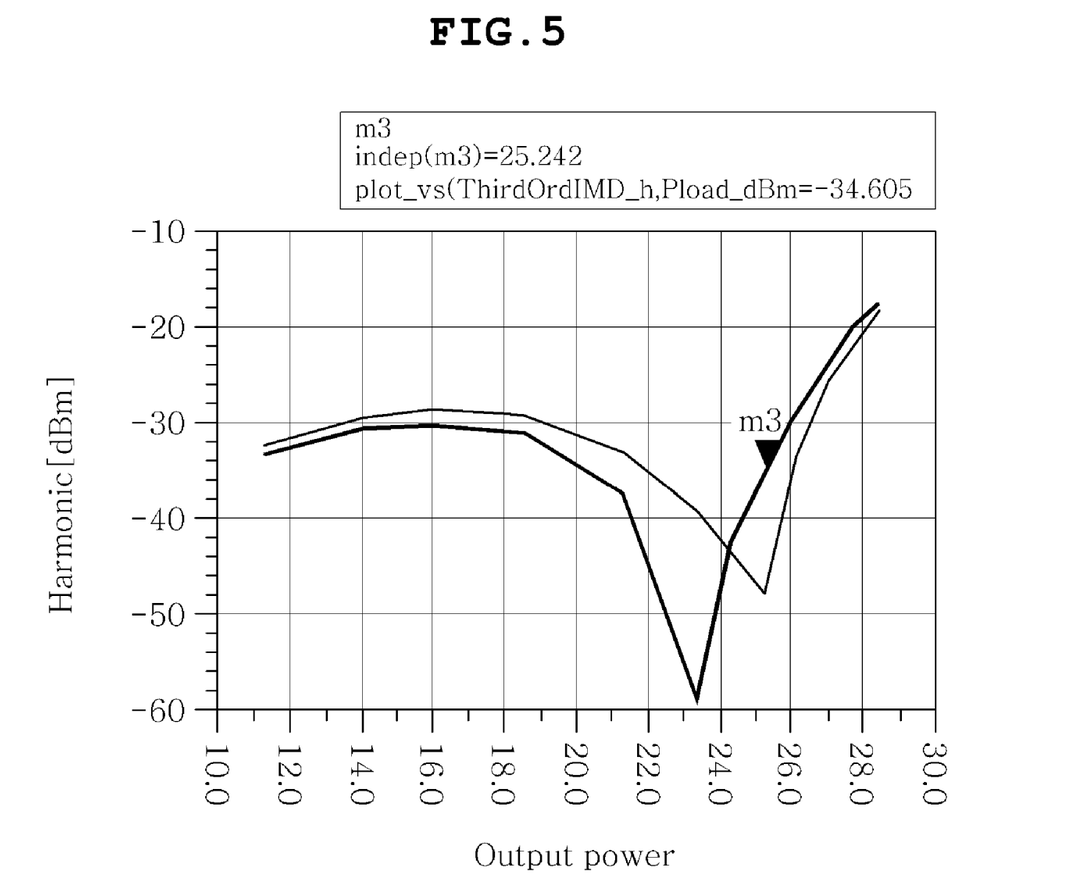
FIG. 5 is a graph illustrating the amplification gain of the power amplifier according to the embodiment of the present invention.
Figure 6:
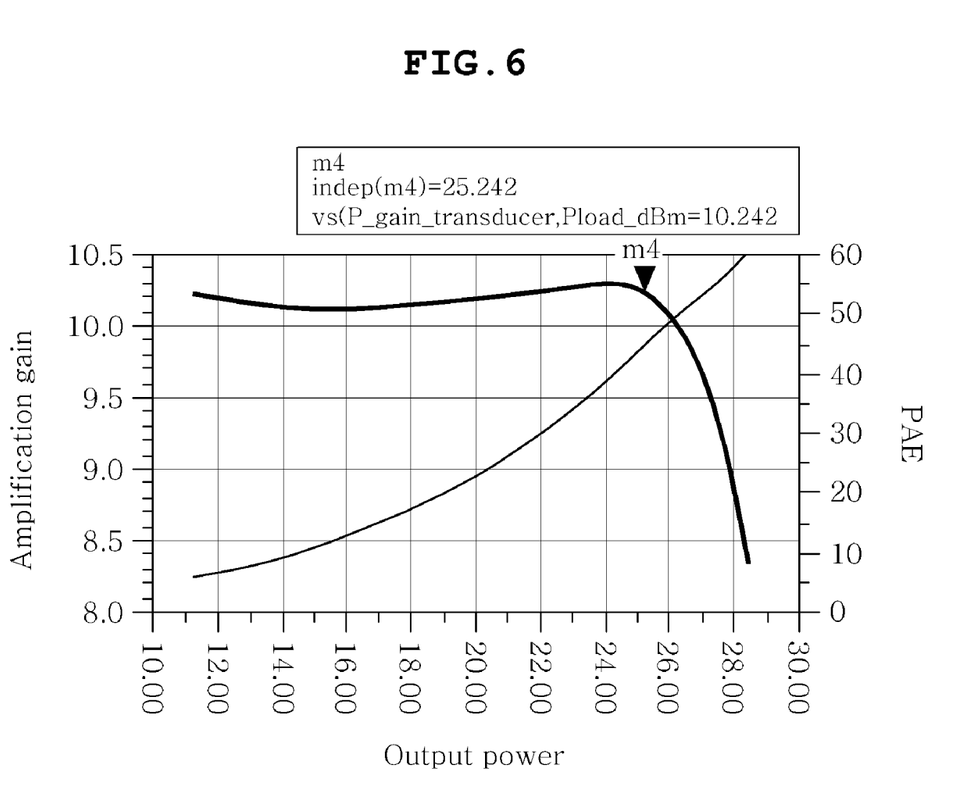
FIG. 6 is a graph illustrating the harmonic characteristic of the power amplifier according to the embodiment of the present invention.

FIG. 5 is a graph illustrating the amplification gain of the power amplifier according to the embodiment of the present invention, and FIG. 6 is a graph illustrating the harmonic characteristic of the power amplifier according to the embodiment of the present invention.

From FIGS. 5 and 6, it can be seen that power the amplifier according to the embodiment of the present invention exhibits has an amplification gain of 10.242 dBm, a power efficiency of 45.041% and a harmonic characteristic of −34.605 dBm at an output power of 25.242 dBm.

That is, it can be seen that the power amplifier according to the embodiment of the present invention improves the gain by about 0.25 dB and the efficiency by about 2% with regard to the linear power output compared to the conventional cascode power amplifier shown in FIG. 1.

Furthermore, the power amplifier according to the embodiment of the present invention has high output and efficiency and the same IMD3 (third-order intermodulation distortion) characteristic m3 compared to the conventional cascode power amplifier shown in FIG. 1.

As a result, the capacitance compensation characteristic of the second common source transistor P1 can be also made use of.

Since the power amplifier according to the embodiment of the present invention uses the transistor having a thick oxide film as described above, it can not only improve the gate oxide film breakdown characteristic of the first common source transistor M1 for amplifying the input signal but also can improve the output gain while using the transistor having a thick oxide film thanks to the use of the PMOSFET.

Furthermore, since the power amplifier according to the embodiment of the present invention deals with breakdown using one PMOSFET and one capacitor, it has a simple configuration, is easy to implement, and can compensate for capacitance using a PMOSFET.

Moreover, the power amplifier according to the embodiment of the present invention not only compensates for capacitance but also improves the gain of the power amplifier by using a PMOSFET, and can tolerate a high peak voltage by laying transistors having long thick oxide films and long gate lengths one on top of another in a stack structure.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A power amplifier, comprising:
a first common source transistor for amplifying an input signal into a predetermined level;
a second common source transistor for compensating for input capacitance and performing auxiliary amplification for the first common source transistor; and
a common gate transistor connected to the first common source transistor in a cascode structure, configured to be connected in parallel to the second common source transistor and prevent the first common source transistor from breaking down, and configured to output a signal amplified by a value obtained by adding gain of the first common source transistor and gain of the second common source transistor to each other.
2. The power amplifier as set forth in claim 1, wherein the first common source transistor, the second common source transistor and the common gate transistor have thick oxide films.
3. The power amplifier as set forth in claim 1, wherein the first common source transistor and the common gate transis- tor are formed of NMOSFETs, and the second common source transistor is formed of a PMOSFET.

4. The power amplifier as set forth in claim 1, wherein the first common source transistor operates at class AB, and the second common source transistor operates at class A.

5. The power amplifier as set forth in claim 1, wherein the second common source transistor is formed to have a size smaller than those of the first common source transistor and the common gate transistor.

6. The power amplifier as set forth in claim 1, further comprising a capacitor connected between a gate terminal of the first common source transistor and a gate terminal of the second common source transistor so as to achieve decoupling between the first common source transistor and the second common source transistor.

\* \* \* \* \*